United States Patent
Hasegawa

(10) Patent No.: US 8,368,418 B2
(45) Date of Patent: Feb. 5, 2013

(54) TESTING APPARATUS FOR MULTIPLE IDENTICAL CIRCUIT COMPONENTS

(75) Inventor: Takashi Hasegawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 289 days.

(21) Appl. No.: 12/742,241

(22) PCT Filed: Nov. 14, 2007

(86) PCT No.: PCT/JP2007/001243
§ 371 (c)(1),
(2), (4) Date: May 10, 2010

(87) PCT Pub. No.: WO2009/063533
PCT Pub. Date: May 22, 2009

(65) Prior Publication Data
US 2010/0271063 A1      Oct. 28, 2010

(51) Int. Cl.
*G01R 31/26*    (2006.01)
(52) U.S. Cl. .............. 324/762.01; 324/750.15; 324/73.1
(58) Field of Classification Search .................. None
See application file for complete search history.

(56) References Cited

U.S. PATENT DOCUMENTS

| 6,374,378 B1 * | 4/2002 | Takano et al. ................. 714/719 |
| 6,766,486 B2 * | 7/2004 | Neeb ............................ 714/724 |
| 7,441,166 B2 * | 10/2008 | Yamada et al. ............... 714/718 |

FOREIGN PATENT DOCUMENTS

| EP | 1063529 | 12/2000 |
| JP | 2002-008391 | 1/2002 |
| JP | 2002-008391 A | 1/2002 |
| JP | 2002-015596 A | 1/2002 |
| JP | 2006-139892 A | 6/2006 |
| KR | 10-2000-0023326 | 4/2000 |

OTHER PUBLICATIONS

PCT International Search Report for PCT Application No. PCT/JP2007/001243 mailed on Feb. 19, 2008.
Korean Office Action issued for corresponding Korean Patent Application No. 10-2010-7013117, and it's English translation.
Office Action issued for related Korean App. No. 10-2010-7013117 dated Mar. 31, 2012; and its English translation.
Office Action for corresponding Taiwanese Patent Application No. 097143412 dated Nov. 16, 2012 and its English translation provided by the client.

* cited by examiner

*Primary Examiner* — Minh N Tang
(74) *Attorney, Agent, or Firm* — Ladas & Parry, LLP

(57) ABSTRACT

Multiple test pins receive, as input data, multiple data output from a DUT. Multiple multiplexers receive the multiple data input to the multiple test pins and selects one of the data thus input, and outputs the data thus selected. Multiple logical comparators are respectively provided for the multiple multiplexers and judge whether or not the data selected by the corresponding multiplexers match the expected values.

9 Claims, 6 Drawing Sheets

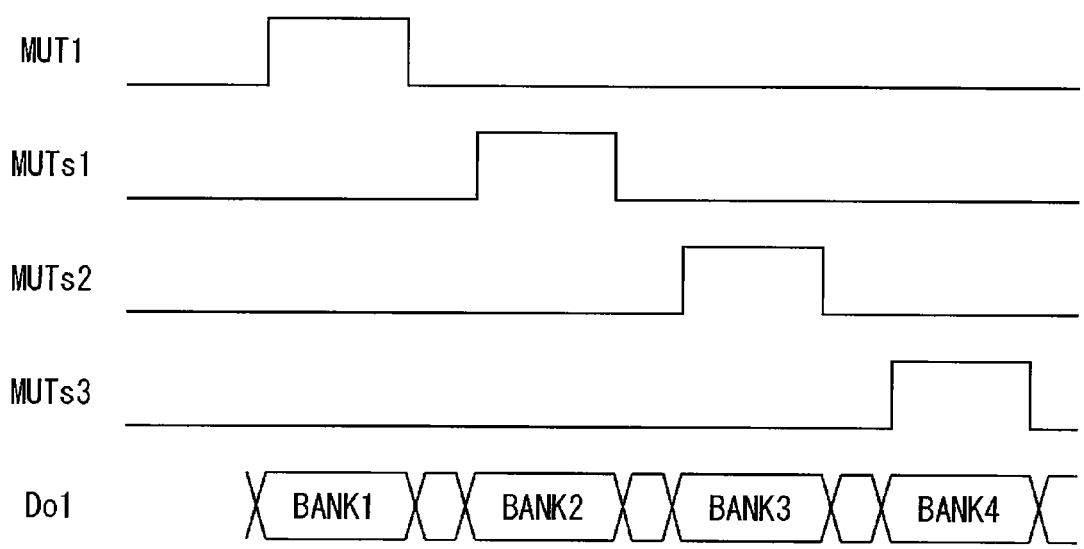

TESTING APPARATUS FOR MULTIPLE IDENTICAL CIRCUIT COMPONENTS

CROSS-REFERENCE TO RELATED APPLICATIONS

This application is the U.S. National Stage of International Patent Application No. PCT/JP2007/001243 filed on Nov. 14, 2007, which claims priority to International Patent Application No. PCT/JP2007/001243 filed on Nov. 14, 2007, the disclosure of which is hereby incorporated by reference in its entirety.

BACKGROUND OF THE INVENTION

1. Field of the Invention

The present invention relates to a test apparatus.

2. Description of the Related Art

A test apparatus is employed in order to judge whether or not a semiconductor integrated circuit operates as designed. The test apparatus supplies a predetermined test pattern to a semiconductor integrated circuit (which will simply be referred to as the "DUT (Device Under Test)" hereafter) so as to instruct the DUT to execute processing according to the test pattern. Where the processing performed by the DUT is completed normally, the DUT is judged to be a non-defective product. For example, in a case in which the DUT is memory, data is temporarily written to the DUT, and the data thus written is read out. Furthermore, the data thus read out is compared with the expected value, thereby judging whether or not the data thus read out matches the expected value.

Now, let us consider a case in which flash memory having a multi-bank structure is a test target. FIG. 1 is a block diagram which shows a configuration of NAND flash memory having a multi-bank structure. Flash memory 200a has a two-bank structure including a first bank BANK1 and a second bank BANK2. Each bank includes memory cells 2 and a relief circuit 4. The memory cells 2 of the two banks, i.e., the memory cells 2 of the BANK1 and the BANK2, share the input/output terminals Pio1 through Pio8. It should be noted that the number of input/output terminals Pio1 through Pio8, i.e., the bus width, is described for exemplary purposes only, and can be determined as desired.

The test apparatus writes predetermined data to the memory cell 2 at a predetermined address. In some cases, data cannot be written to the memory cell 2 normally in a single writing operation. Accordingly, the data written or the data erased is compared with the expected value thereof, and retry operations for writing or erasing data are repeatedly executed until the actual data matches the expected value. An upper limit is set on the number of times the retry operation can be repeated. A cell for which the data writing or data erasing cannot be performed normally within the retry limit is judged to be defective.

In order to reduce the test period time, a block containing cells judged to be defective (which will be referred to as "defective cells" hereafter) is eliminated from the subsequent test items. Accordingly, conventional test apparatuses include a logical comparison unit and a fail stack register for each test pin. The logical comparison unit compares the data input via the corresponding test pin with an expected value so as to judge the quality. If the logical comparison unit detects a defective cell even once, the logical comparison unit asserts a flag in the corresponding fail stack register. The test apparatus stores the addresses of the blocks containing the defective cells (which will be referred to as "defective blocks" hereafter), and creates a map of the defective blocks. The addresses registered in the defective block map are not subjected to subsequent tests.

[Patent Document 1]
 Japanese Patent Application Laid Open No. 2006-139892
[Patent Document 2]
 Japanese Patent Application Laid Open No. 2002-15596

However, as shown in FIG. 1, multi-bank memory has a configuration in which the banks employ common input/output pins. Accordingly, the data output from each bank is input to the same test pin. That is to say, multiple banks are tested by a single logical comparison unit, leading to a problem in that judgment cannot be made regarding which banks contain defective cells. Furthermore, there is a problem in that, in a case in which an operation for generating a test pattern to be written to the flash memory 200a is stopped based upon the value of the fail stack register, when a defective cell is detected at any one of the banks, the testing for the other banks also ends.

The flash memory replaces a defective cell or a defective block with a redundant cell included in the relief circuit 4. However, in a case in which the addresses of the defective cells or the defective blocks (which will be referred to as "defective addresses" hereafter) are stored based upon the judgment results obtained by the logical comparison unit, such an arrangement cannot identify the banks containing the defective cells. This leads to a problem in that the relief circuit 4 cannot perform the appropriate cell replacement.

Such a problem is not restricted to the multi-bank memory, and can occur in an arrangement in which multiple DUTs are connected to a single test pin.

SUMMARY OF THE INVENTION

The present invention has been made in order to solve such a problem. Accordingly, it is a general purpose of the present invention to provide a test apparatus which is capable of suitably testing an arrangement in which multiple data are input to a single test pin.

An embodiment of the present invention relates to a test apparatus configured to test multiple identical circuit components included in at least one test target device, and to judge whether or not test target data output from the multiple identical circuit components match an expected value. The test apparatus comprises: multiple test pins configured to receive, as input data, the test target data output from the multiple identical circuit components; and multiple logical comparators configured such that they can be assigned to desired test pins selected from among the multiple test pins, and configured to judge whether or not the test target data input to the test pin thus assigned matches the expected value. In a case in which the multiple identical circuit components each include similar terminals, data output from each similar terminal is test target data for the same test item, and the similar sets of terminals of the multiple identical circuit components are connected to the multiple test pins in the same manner, logical comparators are assigned to each test pin according to the number of identical circuit components connected to the test pin. When a given identical circuit component outputs the test target data, the logical comparator assigned to this identical circuit component is operated.

The term "identical circuit components" represents circuit blocks or ICs having the same configuration or having the same function.

With such an embodiment, the logical comparators can be assigned to a desired test pin. Thus, in a case in which the data is input to a given test pin from the multiple banks included in a single flash memory, or in a case in which the data for the same test item is input to such a given test pin from multiple different devices, such an arrangement is capable of switching the logical comparators according to the data output source (data generating source), i.e., according to the identical circuit component, thereby providing a suitable test.

Also, the test apparatus may further comprise multiple multiplexers which are respectively provided for the multiple logical comparators, and which are each configured to receive multiple data input via the multiple test pins, to select one from among the multiple data thus input, and to output the data thus selected to the corresponding logical comparator.

With such an embodiment including the multiplexers, multiple logical comparators can be assigned to a given test pin.

Also, the test target device may be multi-bank memory having n (n is an integer of 2 or more) banks provided in increments of relief circuits. Also, the multiple identical circuit components may correspond to the multiple banks.

Such an arrangement is capable of acquiring the test results and the addresses of defective cells in increments of individual banks.

Also, input/output terminals may be shared by the multiple banks. Also, when data is read out from the i-th ($1 \leq i \leq n$) bank, each test pin may receive, as input data, the data output from the i-th bank. Also, the test apparatus may assign n multiplexers to each test pin, and may instruct the multiplexers to select data received via the test pins thus assigned. Also, when the i-th bank is to be tested, the test apparatus may operate the logical comparators that correspond to the i-th multiplexers.

Such an arrangement is capable of suitably operating the logical comparators according to the currently operational bank.

Also, the test apparatus may be configured to test n test target devices each connected to the multiple test pins in the same manner. Also, the multiple identical circuit components may be respectively included in the n test target devices. When data is read out from the i-th ($1 \leq i \leq n$) test target device, each test pin may receive, as input data, the data output from the i-th test target device. Also, the test apparatus may assign n multiplexers to each test pin, and may instruct the multiplexers to select data received via the test pins thus assigned. Also, when the i-th bank is to be tested, the test apparatus may operate the logical comparators that correspond to the i-th multiplexers.

Such an arrangement is capable of suitably operating the logical comparators according to the currently operational test target device.

Also, the multiple multiplexers and the multiple logical comparators may be respectively provided for all the test pins.

Also, the number of the multiplexers and the number of the logical comparators may be each the same as the number of the test pins.

Also, the multiple multiplexers and the multiple logical comparators may be provided so as to provide redundant resources for the multiple test pins.

Also, the test apparatus may further comprise: at least one spare multiplexer; and at least one spare logical comparator provided for the corresponding spare multiplexer, in addition to the multiple multiplexers and the multiple logical comparators respectively provided for the test pins.

Also, the test apparatus may further comprise multiple demultiplexers respectively provided for the multiple test pins instead of the multiple multiplexers. Also, each demultiplexer may output data input via the corresponding test pin to one logical comparator selected from among the multiple logical comparators.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 6 is a time chart which shows the operation states of the logical comparison unit shown in FIG. 5.

DETAILED DESCRIPTION OF THE INVENTION

Figure 1:
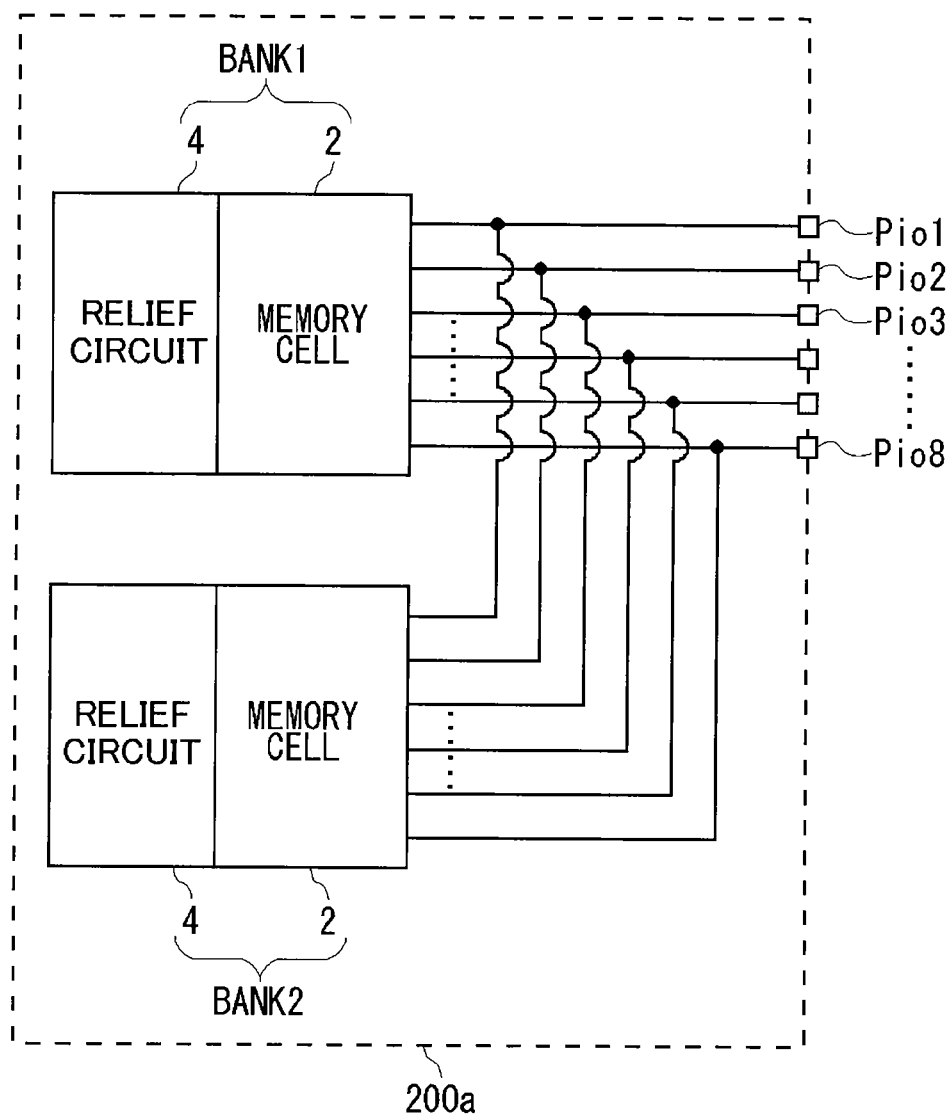
FIG. 1 is a block diagram which shows a configuration of NAND flash memory having a multi-bank structure.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
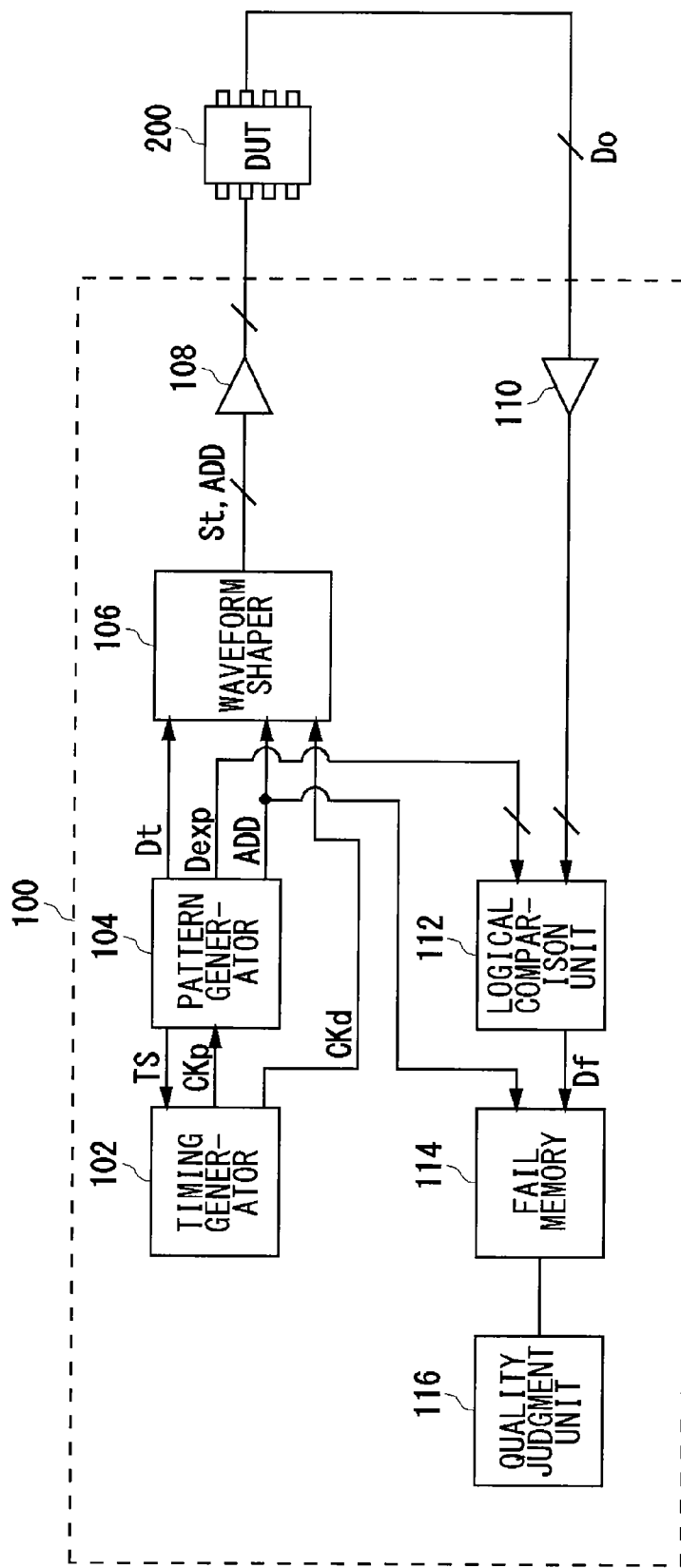
FIG. 2 is a block diagram which shows a configuration of a test apparatus according to an embodiment.

FIG. 2 is a block diagram which shows a configuration of a test apparatus 100 according to an embodiment. The test apparatus 100 judges whether or not the test target data output from a DUT 200 matches an expected value. Specifically, the test apparatus 100 performs a test of multiple identical circuit components included in at least one DUT 200. The test apparatus 100 judges whether or not the test target data output from each of the multiple identical components matches the expected value.

Description will be made below regarding an arrangement in which the DUT 200 is multi-bank NAND flash memory. The test apparatus 100 detects defective blocks included in the DUT (which will also be referred to as the "test target memory" hereafter) 200 in increments of banks so as to stop redundant tests, thereby improving the test throughput. Furthermore, the test apparatus 100 identifies the address of each defective block which is to be replaced by the relief circuit 4 provided for the memory cell.

The test apparatus 100 includes a timing generator 102, a pattern generator 104, a waveform shaper 106, a writing driver 108, a comparator 110, a logical comparison unit 112, fail memory 114, and a quality judgment unit 116.

The pattern generator 104 generates a timing set signal (which will be referred to as the "TS signal" hereafter), and supplies the TS signal thus generated to the timing generator 102. The timing generator 102 generates a periodic clock CKp and a delay clock CKd based upon the timing data indicated by the TS signal, supplies the periodic clock CKp thus generated to the pattern generator 104, and supplies the delay clock CKd thus generated to the waveform shaper 106. Subsequently, the pattern generator 104 generates address data ADD that indicates blocks, which are multiple storage regions included in the DUT 200, and multiple pattern data Dt to be written to the multiple blocks, and supplies the address data ADD and the test pattern data Dt to the waveform shaper 106.

Based upon the delay clock CKd supplied by the timing generator 102, the waveform shaper 106 generates a test pattern signal St that corresponds to the test pattern data Dt generated by the pattern generator 104. Subsequently, the waveform shaper 106 supplies, to the test target memory 200 via the writing driver 108, the address data ADD supplied from the pattern generator 104 and the test pattern signal St thus generated.

Furthermore, the pattern generator 104 generates expected value data Dexp beforehand which is data that should be output from the test target memory 200 according to the address data ADD and the test pattern signal St, and supplies the expected value data Dexp thus generated to the logical comparison unit 112.

The comparator 110 reads out data Do that corresponds to the address data ADD from the DUT 200, and outputs the data Do thus read out to the logical comparison unit 112. The logical comparison unit 112 compares the data Do read out from the test target memory 200 with the expected value data Dexp supplied from the pattern generator 104, and where the output data Do does not match the expected value data Dexp, the logical comparison unit 112 outputs fail data Df.

The fail memory 114 sequentially stores the fail data Df output from the logical comparison unit 112, while assigning it to the address data ADD generated by the pattern generator 104. Furthermore, the fail memory 114 counts the amount of fail data output from the logical comparison unit 112 in increments of banks. Subsequently, the quality judgment unit 116 judges the quality of the test target memory 200 based upon the fail data stored in the fail memory 114 and the amount of fail data counted by the fail memory 114.

In FIG. 2, in order to facilitate understanding, a set of multiple data lines and a set of multiple address lines are each represented by a single line. The number of the data lines and the number of the address lines included in an actual circuit each correspond to the bus width of the DUT 200.

Figure 3:
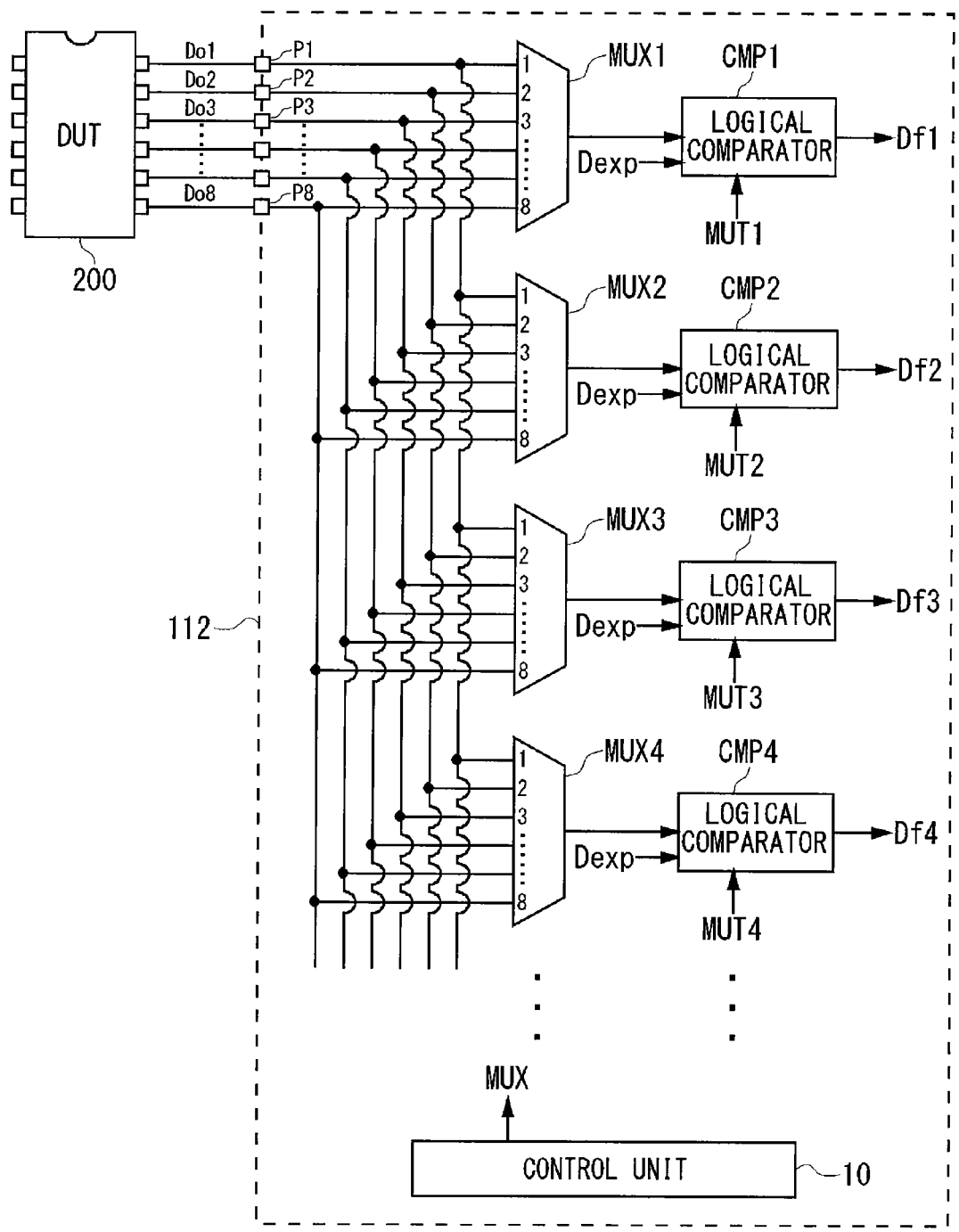
FIG. 3 is a block diagram which shows a configuration of a logical comparison unit shown in FIG. 2.

FIG. 3 is a block diagram which shows a configuration of the logical comparison unit 112 shown in FIG. 2. The logical comparison unit 112 includes multiple test pins P1, P2, and so on, (which will be collectively referred to as "test pins P" as necessary), multiple multiplexers MUX1, MUX2, and so on, (which will be collectively referred to as "multiplexers MUX" as necessary), multiple logical comparators CMP1, CMP2, and so on, (which will be collectively referred to as "logical comparators CMP" as necessary), and a control unit 10.

The multiple test pins P1 through P8 receive, as input data, multiple data Do1 through Do8 output from the DUT 200 (multiple identical circuit components). The number of the test pins P and the number of the data Do can be each determined as desired, and are determined based upon the type of the DUT 200 and the bus width thereof.

Each multiplexer MUX includes multiple input terminals 1 through 8. The input terminals 1 through 8 of each multiplexer MUX receives, as input data, the data Do1 through Do8 input to the multiple test pins P1 through P8, respectively. Each multiplexer MUX selects one of the multiple data Do1 through Do8, and outputs the data thus selected. It should be noted that the comparator (input buffer) 110 shown in FIG. 2 is provided as a component upstream of or downstream of the multiplexer MUX.

The multiple logical comparators CMP1 through CMP4 are provided for the multiple multiplexers MUX1 through MUX4, respectively. The logical comparator CMPi (i represents an integer) judges whether or not the data Doi selected by the corresponding multiplexer MUXi matches the expected value Dexpi. Each logical comparator CMP outputs the fail data Df shown in FIG. 2.

The logical comparators CMP1 through CMP4 are each configured to select one of the multiple test pins P1 through P8 as desired, and to judge whether or not the test target data input to the test pin thus selected matches the expected value.

The control unit 10 indicates to each of the multiplexers MUX1 through MUX4 which of the multiple data Do input to the multiple test pins P it should select. Furthermore, comparison enable cycle signals MUT1 through MUT4, which indicate the timing at which the logical comparators CMP1 through CMP4 are to perform the comparison operation, are generated by an unshown pattern generator (104 in FIG. 2).

Description will be made below regarding the operation of the test apparatus 100 under the assumption that the multiple identical circuit components each have similar terminals, and that the similar terminals of the multiple identical circuit components output test target data for the same test item.

In summary, when the terminals of the multiple identical circuit components are respectively connected to the multiple test pins such that similar terminals thereof are connected to a single corresponding test pin, the test apparatus 100 assigns the logical comparators to each test pin according to the number of identical circuit components connected to the test pin. When a certain identical circuit component outputs the test target data, the test apparatus 100 operates the logical comparator assigned to this identical circuit component. Specific description will be made below.

The DUT 200 is multi-bank memory having n (n represents an integer of 2 or more) banks, and the input/output terminals are shared by the multiple banks. When the data is to be read out from the i-th ($1 \leq i \leq n$) bank, the data read out from the i-th bank is input to the test pins P1 through P8. Each bank corresponds to an identical circuit component.

The test apparatus 100 assigns n multiplexers MUX to each test pin P, and instructs the multiplexers MUX to select the data Do output from the test pin P thus assigned. Furthermore, when the i-th bank is to be tested, the test apparatus 100 operates the logical comparators CMP that correspond to the i-th bank.

Specifically, in a case in which two-bank memory is to be tested, two multiplexers MUX are assigned to each test pin. That is to say, the multiplexers MUX1 and MUX2 are assigned to the test pin P1, and the multiplexers MUX3 and MUX4 are assigned to the test pin P2. Also, two multiplexers are assigned to each of the other test pins.

The multiplexers MUX1 and MUX2 each select the data Do1 input to the test pin P1 thus assigned, and each output the data Do1 thus selected to the logical comparator CMP1. Furthermore, the multiplexers MUX3 and MUX4 each select the data Do2 input to the test pin P2 thus assigned, and each output the data Do2 thus selected to the logical comparator CMP2.

Figure 4:
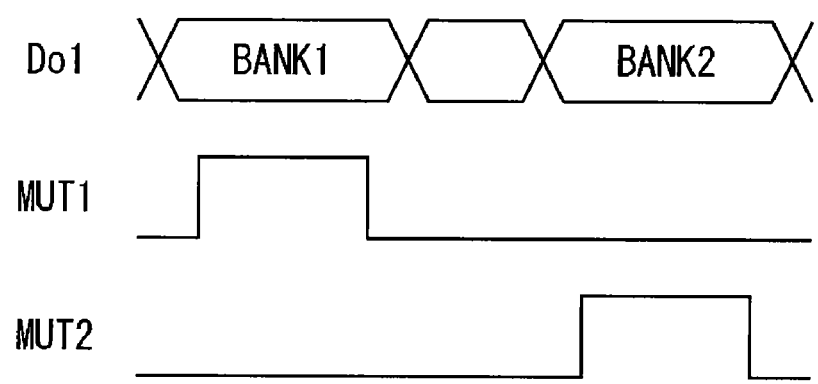
FIG. 4 is a time chart which shows the operation states of the logical comparison unit shown in FIG. 3.

The above is the configuration of the test apparatus 100. Next, description will be made regarding the operation of the test apparatus 100. FIG. 4 is a time chart which shows the operation states of the logical comparison unit 112 shown in FIG. 3. FIG. 4 shows the output data Do1, and the comparison enable cycle signals MUT1 and MUT2, in this order, from the top. As shown in the drawing, when the output data Do1 is data output from the first bank BANK1, the comparison enable cycle signal MUT1 is set to the high-level state, whereby the logical comparator CMP1 becomes active. Furthermore, when the output data Do1 is data output from the second bank BANK2, the logical comparator CMP2 becomes active. The control unit 10 acquires the bank to be accessed with reference to the address data ADD, and sets the comparison enable cycle signal MUT that corresponds to the bank to be accessed to the high-level state.

Furthermore, for the output data Do2, the levels of the comparison enable cycle signals MUT3 and MUT4 are each switched according to the bank to be accessed, in the same way as shown in FIG. 4.

As described above, with the test apparatus 100 according to the embodiment, the logical comparators CMP are assigned to each test pin according to the number of banks. Thus, such an arrangement is capable of identifying defective blocks in increments of banks, thereby holding the addresses of defective blocks in increments of banks.

As a result, in a case in which a defective cell has been detected in a certain block of a certain bank, such an arrangement is capable of stopping subsequent tests for only the defective block thus detected. Furthermore, such an arrangement is capable of replacing the defective blocks with the cells included in the relief circuit 4 in increments of banks.

Seen from another point of view, the logical comparison unit 112 according to an embodiment has a configuration in which multiple multiplexers MUX and multiple logical comparators CMP are respectively provided for the test pins P. With such an arrangement, when the data (Do1) input to a certain pin (e.g., P1) is to be tested, in addition to the logical comparator (CMP1) provided for this test pin (P1), a logical comparator provided for a different pin for which data judgment is not necessary is assigned to the test pin to be tested. For example, in a case in which the test pin P5 is a driver pin connected to a chip enable terminal, chip select terminal, write enable terminal, and read enable terminal, the logical comparator (not shown) that corresponds to the test pin P5 is not used for the test pin 5. By assigning such an unused logical comparator CMP to the test pin P1 by means of the multiplexer, such an arrangement makes effective use of limited hardware resources. That is to say, such an arrangement is capable of testing multi-bank memory without increasing the number of logical comparators CMP, as compared with conventional test apparatuses. That is to say, with such an embodiment, the number of multiplexers MUX and the number of logical comparators CMP may be the same as the number of test pins.

Furthermore, by providing the multiplexers, the multiple logical comparators CMP can be assigned to to each test pin in a flexible manner. As a result, such an arrangement provides a suitable test without being restricted by conditions such as the number of pins of the DUT 200, the pin layout, etc.

In a case in which the DUT 200 has many banks, the logical comparison unit 112 may include more multiplexers and more logical comparators, in addition to the multiplexers and logical comparators respectively provided for the test pins. That is to say, the number of multiplexers MUX and the number of logical comparators CMP may each be greater than the number of test pins.

Figure 5:
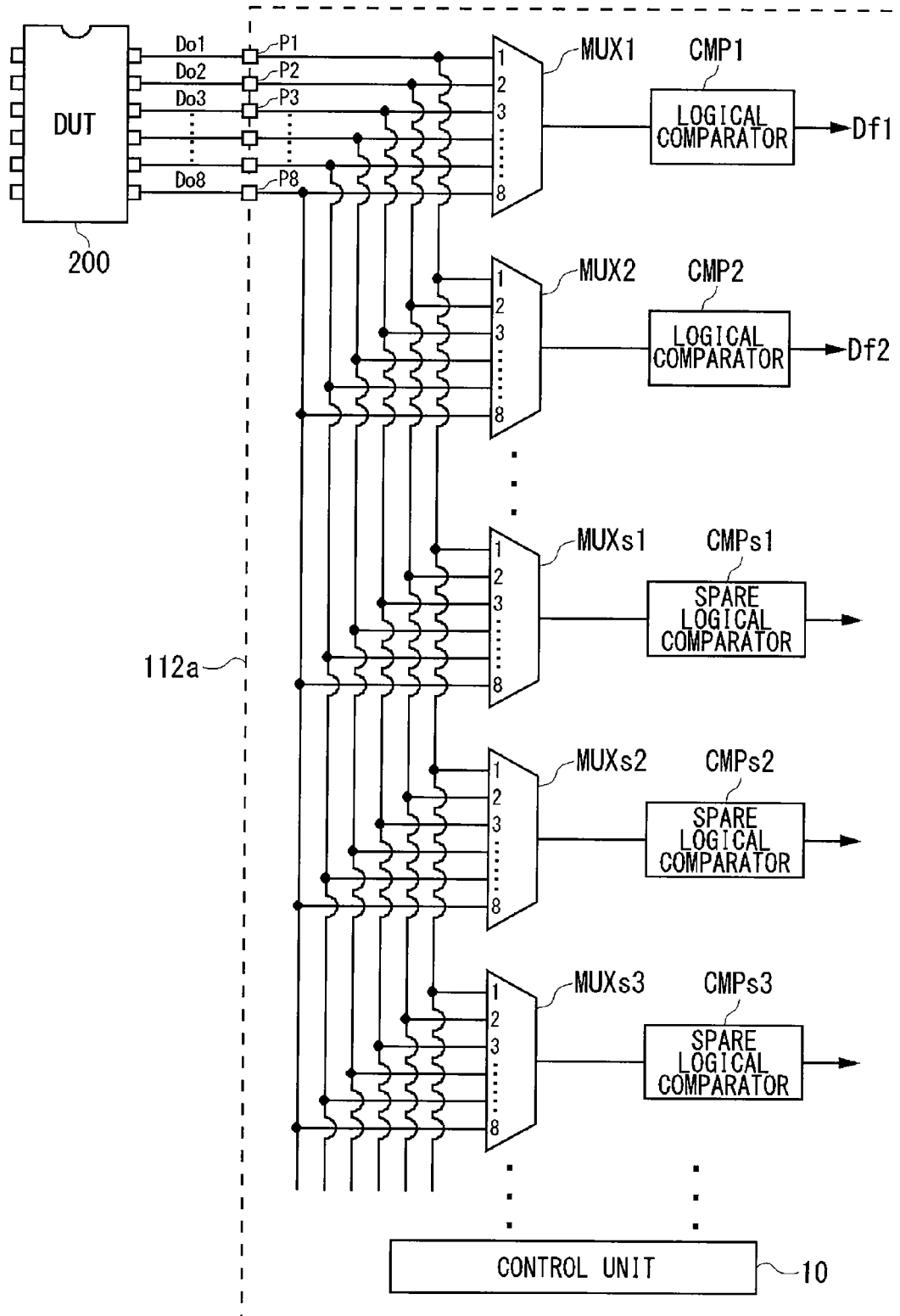
FIG. 5 is a block diagram which shows a configuration of a logical comparison unit according to a modification.

FIG. 5 is a block diagram which shows a configuration of a logical comparison unit 112a according to a modification. The logical comparison unit 112a includes spare multiplexers MUXs1, MUXs2, MUXs3, and so on, and spare and so on, in addition to the multiplexers MUX1, MUX2, MUX3, and so on, and the logical comparators CMP1, CMP2, CMP3, and so on, respectively provided for the test pins. That is to say, the multiple multiplexers MUX and the multiple logical comparators CMP are provided for the multiple test pins so as to provide a redundant processing resource for the multiple test pins.

In a case in which ordinary single-bank memory is to be tested, the spare multiplexers MUXs and the spare logical comparators CMPs are not used, and only the multiplexers MUX1, MUX2, and so on, and the logical comparators CMP1, CMP2, and so on, respectively provided for the test pins are used.

In general, the logical comparator CMP provided for each test pin P is configured together with an input buffer (or input comparator) configured to receive a signal input to the test pin P. Furthermore, an output buffer (driver), which is used to output a signal to the test pin P, is configured as a component which forms a pair with the input buffer. Also, according to an embodiment, an arrangement may be made that does not include any output buffer corresponding to the spare logical comparators CMPs. Such an arrangement provides a reduced circuit area.

FIG. 6 is a time chart which shows the operation states of the logical comparison unit 112a shown in FIG. 5. Description will be made regarding the operation in a case in which the data Do1 input to the test pin P1 is to be tested with respect to four-bank memory as a test target. In this case, four pairs of a multiplexer and a logical comparator are assigned to the test pin 1, and the four pairs thus assigned to the test pin 1 are respectively assigned to four banks. The four multiplexers and the four logical comparators to be assigned should be selected from among the regular logical comparator and the spare logical comparators. For example, the spare multiplexers MUXs1 through MUXs3 and the spare logical comparators CMPs1 through CMPs3 are assigned to the test pin 1, in addition to the pair of the multiplexer MUX1 and the logical comparator CMP1 provided for the test pin P1.

In the same way, spare multiplexers MUXs4 through MUXs6 (not shown) and spare logical comparators CMPs4 through CMPs6 (not shown) are assigned to the test pin P2, in addition to the multiplexer MUX2 and the logical comparator CMP2. The same can be said of the other test pins P3, P4, and so on.

Subsequently, the control unit 10 instructs the four multiplexers MUX1 and MUXs1 through MUXs3 to select and output the data Do1 input to the test pin P1. In a case in which the data Do1 is output in order from the first through fourth banks, the comparison enable cycle signals MUT1, MUTs1, MUTs2, and MUTs3 are set to the high-level state in this order synchronously with the data output from the banks, and thus only the necessary logical comparator becomes active.

With such a modification shown in FIG. 5 including several spare logical comparators as a redundant processing resource, multiple logical comparators can be assigned to each test pin in a case in which multiple-bank memory is tested.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention.

Description has been made in the embodiment regarding an arrangement in which multi-bank memory is to be tested. However, the test target of the test apparatus 100 is not restricted to such an arrangement. For example, the test apparatus 100 can be used to simultaneously test multiple devices connected to a common bus.

That is to say, the test target of the test apparatus 100 may be n test target devices which are connected to the multiple test pins P1 through P8 in the same manner. When data is read out from the i-th ($1 \leq i \leq n$) test target device, the data output from the i-th test target device is input to these test pins. With such an arrangement, the test apparatus 100 assigns n multiplexers to each test pin, and instructs the corresponding multiplexer to select the data input to the test pin thus assigned. Furthermore, when the i-th test target device is to be tested, the test apparatus 100 operates the logical comparator that corresponds to the i-th multiplexer.

That is to say, the test apparatus 100 can be extensively applied to arrangements in which multiple data output from multiple different devices or memory regions are input to a single test pin in a time sharing manner.

Description has been made in the embodiment regarding an arrangement in which the data is assigned to the logical comparators CMP by means of the multiplexers. Also, an arrangement may be made including multiple demultiplexers instead of the multiple multiplexers. Each demultiplexer outputs the data input to the corresponding test pin to one logical comparator selected from among the multiple logical comparators. Such an arrangement also provides the same operation as with the embodiment.

The spirit and the technical scope of the present invention can be described as follows, in addition to or instead of the appended claims. 1. An embodiment of the present invention relates to a test apparatus configured to judge whether or not test target data output from a test target device matches an expected value. The test apparatus comprises: multiple test pins configured to receive, as input data, multiple data output from the test target device; multiple multiplexers configured to receive multiple data input to the multiple test pins, to select one of the data thus input, and to output the data thus selected; and multiple logical comparators respectively provided for the multiple multiplexers, and configured to judge whether or not the data selected by the corresponding multiplexer matches the expected value.

With such an embodiment including the multiplexers, multiple logical comparators can be assigned to a given test pin. As a result, in a case in which the data output from multiple banks included in a single flash memory is input to the test pin, or in a case in which the data output from multiple different devices is input to the test pin, such an arrangement is capable of switching the logical comparators according to the data output source (data generating source), thereby providing a suitable test.

2. The test device may be multi-bank memory having n (n is an integer of 2 or more) banks, and the input/output terminals may be shared by the multiple banks. When the data is read out from the i-th ($1 \leq i \leq n$) bank, the data output from the i-th bank is input to each test pin. The test apparatus may assign n multiplexers to each test pin, and may instruct the multiplexers to select data received via the test pins thus assigned. Also, when the i-th bank is to be tested, the test apparatus may operate the logical comparators that correspond to the i-th multiplexers.

Such an arrangement is capable of suitably operating the logical comparators that correspond to the currently operational bank. 3. The test apparatus may test n test target devices which are connected to the multiple test pins in the same manner. When the data is read out from the i-th ($1 \leq i \leq n$) test target device, the data output from the i-th test target device is input to each test pin. The test apparatus may assign n multiplexers to each test pin, and may instruct the multiplexers to select data received via the test pin thus assigned. Also, when the i-th test target device is to be tested, the test apparatus may operate the logical comparators that corresponds to the i-th multiplexers.

Such an arrangement is capable of suitably operating the logical comparators that correspond to the currently operational bank.

4. The multiple multiplexers and the multiple logical comparator may be respectively provided for all the test pins.

5. Also, the number of the multiplexers and the number of the logical comparators may be each the same as the number of the test pins.

6. Also, the multiple multiplexers and the multiple logical comparators may be provided so as to provide redundant resources for the multiple test pins.

7. Also, the test apparatus according to an embodiment may further comprise: at least one spare multiplexer; and at least one spare logical comparator provided for the corresponding spare multiplexer, in addition to the multiple multiplexers and the multiple logical comparators respectively provided for the test pins.

8. Also, the test apparatus according to an embodiment may comprise multiple demultiplexers respectively provided for the multiple test pins instead of the multiple multiplexers. Also, each demultiplexer may output data input via the corresponding test pin to one logical comparator selected from among the multiple logical comparators.

9. With such an arrangement including the demultiplexers instead of the multiplexers, in a case in which the data is input to a given test pin from multiple banks included in a single flash memory, or in a case in which the data is input to such a given test pin from multiple different devices, the logical comparators are switched according to the data output source (data generating source), thereby providing a suitable test.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A test apparatus configured to test a plurality of identical circuit components included in at least one test target device, and to judge whether or not test target data output from the plurality of identical circuit components match an expected value, the test apparatus comprising:
   a plurality of test pins configured to receive, as input data, the test target data output from the plurality of identical circuit components; and
   a plurality of logical comparators each of which is configured to be assigned to a test pin selected from among the plurality of test pins, and configured to judge whether or not the test target data input to the test pin thus assigned matches the expected value; and a plurality of multiplexers where are respectively provided for the plurality of logical comparators, and which are configured to receive a plurality of data input via the plurality of test pins, to select one from among the multiple data thus input, and to output the data thus selected to the a respective one of the plurality of logical comparators;

wherein the plurality of identical circuit components respectively include corresponding terminals, data output from the corresponding terminals of the plurality of identical circuit components are test target data for the same test item, and the corresponding terminals of the plurality of identical circuit components are connected to corresponding ones of the plurality of test pins in the same manner, wherein multiple n logical comparators are assigned to each test pin, n being the number of identical circuit components in the plurality of identical circuit components;

and wherein, when a given identical circuit component outputs the test target data, the logical comparator assigned to this identical circuit component is operated.

2. A test apparatus according to claim 1, wherein the test target device is multi-bank memory having n (n is an integer of 2 or more) banks provided in increments of relief circuits, and wherein the plurality of identical circuit components correspond to the plurality of banks.

3. A test apparatus according to claim 2, wherein the plurality of banks employs input/output terminals that are shared by the plurality of banks, and wherein, when data is read out from the i-th ($1 \leq i \leq n$) bank, each test pin receives, as input data, the data output from the i-th bank, and wherein the test apparatus assigns n multiplexers to each test pin, and instructs the multiplexers to select data received via the test pins thus assigned, and wherein, when the i-th bank is to be tested, the test apparatus operates the logical comparators that correspond to the i-th multiplexers.

4. A test apparatus according to claim 1, configured to test n test target devices each connected to the plurality of test pins in the same manner, wherein the plurality of identical circuit components are respectively included in the n test target devices, and wherein, when data is read out from the i-th ($1 \leq i \leq n$) test target device, each test pin receives, as input data, the data output from the i-th test target device, and wherein the test apparatus assigns n multiplexers to each test pin, and instructs the multiplexers to select data received via the test pins thus assigned, and wherein, when the i-th bank is to be tested, the test apparatus operates the logical comparators that correspond to the i-th multiplexers.

5. A test apparatus according to claim 1, wherein the plurality of multiplexers and the plurality of logical comparators are respectively provided for all the test pins.

6. A test apparatus according to claim 1, wherein the number of the multiplexers and the number of the logical comparators are each the same as the number of the test pins.

7. A test apparatus according to claim 1, wherein the plurality of multiplexers and the plurality of logical comparators are provided so as to provide redundant resources for the plurality of test pins.

8. A test apparatus according to claim 1, further comprising:
at least one spare multiplexer; and
at least one spare logical comparator provided for the corresponding spare multiplexer, in addition to the plurality of multiplexers and the plurality of logical comparators respectively provided for the test pins.

9. A test apparatus according to claim 1, comprising a plurality of demultiplexers respectively provided for the plurality of test pins instead of the plurality of multiplexers, and wherein each demultiplexer outputs data input via the corresponding test pin to one logical comparator selected from among the plurality of logical comparators.

* * * * *